United States Patent
Xle et al.

(10) Patent No.: US 10,502,586 B2
(45) Date of Patent: Dec. 10, 2019

(54) INDUCTIVE TRANSDUCER SHIELDING METHOD

(71) Applicant: SHANGHAI LANBAO SENSING TECHNOLOGY CO., LTD., Shanghai (CN)

(72) Inventors: Yong Xle, Shanghai (CN); Chunhua Jiang, Shanghai (CN)

(73) Assignee: Shanghai Lanbao Sensing Technology Co., Ltd., Shanghai (CN)

( * ) Notice: Subject to any disclaimer, the term of this patent is extended or adjusted under 35 U.S.C. 154(b) by 118 days.

(21) Appl. No.: 15/551,903

(22) PCT Filed: Sep. 11, 2015

(86) PCT No.: PCT/CN2015/089405
§ 371 (c)(1),
(2) Date: Aug. 17, 2017

(87) PCT Pub. No.: WO2016/041466
PCT Pub. Date: Mar. 24, 2016

(65) Prior Publication Data
US 2018/0252551 A1    Sep. 6, 2018

(30) Foreign Application Priority Data

Sep. 17, 2014    (CN) .......................... 2014 1 0474732

(51) Int. Cl.
| | |
|---|---|
| *G01D 3/036* | (2006.01) |
| *G01D 3/028* | (2006.01) |
| *G01D 5/20* | (2006.01) |

(52) U.S. Cl.
CPC ............. *G01D 3/036* (2013.01); *G01D 3/028* (2013.01); *G01D 5/20* (2013.01)

(58) Field of Classification Search
CPC ............... G01D 3/36; G01D 3/20; G01D 3/28
See application file for complete search history.

(56) References Cited

U.S. PATENT DOCUMENTS

| | | | | |
|---|---|---|---|---|
| 3,996,510 | A | * 12/1976 | Guichard | ............... G01V 3/102 |
| | | | | 327/510 |
| 5,264,733 | A | * 11/1993 | Tigges | ............... H03K 17/9505 |
| | | | | 307/116 |
| 10,088,337 | B2 | * 10/2018 | Schroeder | ........... F16C 32/0406 |

(Continued)

*Primary Examiner* — Dominic E Hawkins
(74) *Attorney, Agent, or Firm* — Liang Legal Group, PLLC

(57) ABSTRACT

A method for shielding an inductive sensor includes arranging an annular shielding coil outside an annular detection coil, the shielding coil surrounds the detection coil, and the radial thickness of the shielding coil is smaller than that of the detection coil. An inductive sensor adopting the above method for shielding the inductive sensor, in which the shielding coil is arranged outside the detection coil of the inductive sensor, magnetic fields generated by the two coils are opposite in direction and partially cancel out each other. When interference exists, the magnetic fields generated by the two coils are influenced at the same time and are attenuated or increased by identical strength. Therefore, the summed magnetic field strength can be kept constant, resonance voltages cannot be attenuated, the interference rejection of the inductive sensor is improved, and the sensitivity of the inductive sensor is not influenced.

6 Claims, 3 Drawing Sheets

(56) References Cited

U.S. PATENT DOCUMENTS

| | | | | |
|---|---|---|---|---|
| 2002/0177237 | A1* | 11/2002 | Shvets | B01L 3/0265 |
| | | | | 436/180 |
| 2008/0204118 | A1* | 8/2008 | Kuhn | H03K 17/9505 |
| | | | | 327/517 |
| 2008/0315868 | A1* | 12/2008 | Niwa | G01D 3/02 |
| | | | | 324/207.16 |
| 2012/0081107 | A1* | 4/2012 | Fitch | G01B 7/023 |
| | | | | 324/207.15 |
| 2012/0299585 | A1* | 11/2012 | Hoenicka | G01B 7/003 |
| | | | | 324/207.15 |
| 2013/0147470 | A1* | 6/2013 | Mulholland | G01D 5/204 |
| | | | | 324/225 |
| 2013/0229065 | A1* | 9/2013 | Robertson | H05K 9/0075 |
| | | | | 307/104 |

* cited by examiner

INDUCTIVE TRANSDUCER SHIELDING METHOD

CROSS REFERENCE TO RELATED APPLICATIONS

This is a Continuation Application of PCT/CN2015/089405, filed on Sep. 11, 2015 and claimed the priority of Chinese Application No. 201410474732.4, filed on Sep. 17, 2014. The disclosures of these prior applications are incorporated by reference in their entirety.

TECHNICAL FIELD

The present invention relates to an inductive sensor, and more particularly, to a method for shielding an inductive sensor.

BACKGROUND ART

The existing common inductive sensors are divided into inductive sensors with ferrite pot cores and inductive sensors without ferrite pot cores.

The inductive sensor with a ferrite pot core is used for detecting metal by using a coil system consisting of a ferrite pot core and a coil wound on the ferrite pot core. The ferrite pot core has a self-shielded structure and has only an opening in one direction so that the magnetic field generated by the coil system is present only in the opening direction. As shown in FIG. 1a and FIG. 1b, the sensor comprises a housing 1.1, a connecting cable 1.3 and a coil system 1.8, which is formed by winding a coil 1.7 inside a ferrite pot core 1.5. This sensor has a magnetic field only in a front detection area 1.2 of the housing 1.1 of the sensor. This sensor is not affected by slight electromagnetic interference, but if there is a strong electromagnetic interference near the sensor, such as a welding robot, this may affect the magnetic properties of the ferrite core leading to interfere with the sensor.

As to an inductive sensor without a ferrite pot core, a coil is wound around a plastic pipe. Such sensor is relatively wide in magnetic field distributions. In order to obtain a directional magnetic field, metal rings or metal pipes having different thicknesses and favorable conductivity are additionally arranged around the coil of the sensor. For example, copper is used to completely surround the side surface of the coil to weaken the radial magnetic field of the detection coil, leaving only the magnetic field in front of the detection coil. As shown in FIG. 1a and FIG. 1c, the sensor comprises a housing 1.1, a connecting cable 1.3 and a coil system 1.8 which is formed by winding a coil 1.7 around the plastic pipe 1.10. The coil 1.7 is also surrounded by a copper ring 1.9, such that this sensor has a magnetic field only in a front detection area 1.2 of the housing 1.1 of the sensor. However, this sensor also reduces the influence of the surrounding metal on the sensor, and also weakens the magnetic field on a detection area 1.2 and reduces the sensitivity of the sensor.

SUMMARY OF THE INVENTION

An objective of the present invention is to provide a method for shielding an inductive sensor, which can improve the interference rejection of the inductive sensor due to an external magnetic field and reduce the influence of the surrounding metal to the sensor without affecting the detection sensitivity of the inductive sensor.

The present invention is realized by the following technical scheme:

A method for shielding an inductive sensor includes an annular shielding coil arranged outside an annular detection coil, wherein the shielding coil surrounds the detection coil, and the radial thickness of the shielding coil is smaller than that of the detection coil. The magnetic field generated by the shielding coil and the magnetic field generated by the detection coil are opposite in directions and partially cancel out each other. The two magnetic fields are decreased or increased at the same time, such that the summed magnetic field strengths (i.e., net magnetic field strength) of the magnetic field generated by the shielding coil and the magnetic field generated by the detection coil can be kept constant.

An inductive sensor of the invention adopts the above-described method for shielding. The inductive sensor includes a housing that is cylindrical and at least two annular detection coils, which are successively arranged in an axial direction of the housing, provided inside the housing, wherein each detection coil is surrounded by at least one annular shielding coil, and the radial thickness of the shielding coil is smaller than that of the detection coil.

In some embodiments, the detection coil of the sensor is wound on a plastic pipe, and an insulating material is filled between the detection coil and the shielding coil.

The sensor further comprises a testing circuit. The testing circuit comprises resonant circuits, voltage dividing circuits, a shielding circuit, and a differential amplifying circuit. The two detection coils are each separately connected in series with a resonant capacitor to form resonant circuits, which are then connected in parallel to the output end of a power source. The two resonant circuits have identical resonant frequency, and the two resonant voltages generated by the resonant circuits are respectively divided by the voltage dividing circuits having the same voltage division ratio, and are then connected to the positive and negative input terminals of the differential amplifying circuit, respectively. The two shielding coils are connected, via a voltage follower, to the positive and negative input terminals of the differential amplifying circuit respectively. A ratio of the number of turns of the detection coil to the number of turns of the shielding coil surrounding the detection coil is proportional to the voltage division ratio of the voltage dividing circuit.

In some embodiments, the detection coil of the sensor is wound on a ferrite pot core, and the shielding coil is wound on a housing of the ferrite pot core.

The sensor further comprises a testing circuit. The testing circuit comprises resonant circuits, voltage dividing circuits, a shielding circuit and a differential amplifying circuit. The two detection coils are each respectively connected in series with a resonant capacitor to form the resonant circuits, which are then connected in parallel to the output end of a power/voltage source. The two resonant circuits have identical resonant frequency. The two resonant voltages generated by the resonant circuits are respectively divided by the voltage dividing circuits having the same voltage division ratio, and are then connected to positive and negative input ends of the differential amplifying circuit, respectively. The two shielding coils are connected, via a voltage follower, to the positive and negative input ends of the differential amplifying circuit, respectively. A ratio of the number of turns of the detection coil to the number of turns of the shielding coil surrounding the detection coil is proportional to the voltage division ratio of the voltage dividing circuit.

The present invention has the beneficial effects that: a shielding coil is additionally arranged outside the original detection coil of an inductive sensor. The magnetic fields generated by the two coils are opposite in direction and partially cancel out each other. When interference exists, the magnetic fields generated by the two coils are influenced at the same time and are attenuated or increased by identical strength. Therefore, the summed magnetic field strength can be kept constant, resonance voltages cannot be attenuated, the interference rejection of the inductive sensor is improved, and the sensitivity of the inductive sensor is not affected.

BRIEF DESCRIPTION OF THE DRAWINGS

FIG. 2b shows a schematic cross-sectional view of FIG. 2a;

Figure 1A:
FIG. 1a shows an external view of a prior art inductive sensor.
Figure 1B:
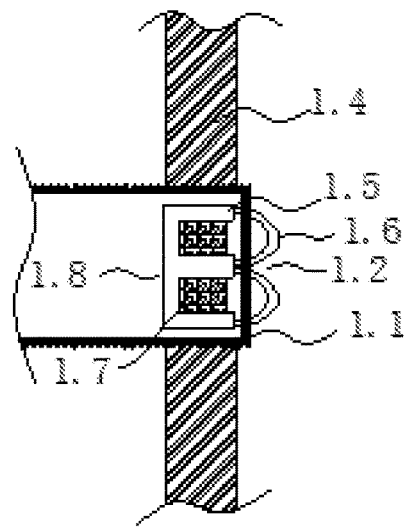
FIG. 1b shows an internal structure diagram of an inductive sensor with a prior art ferrite pot core.
Figure 1C:
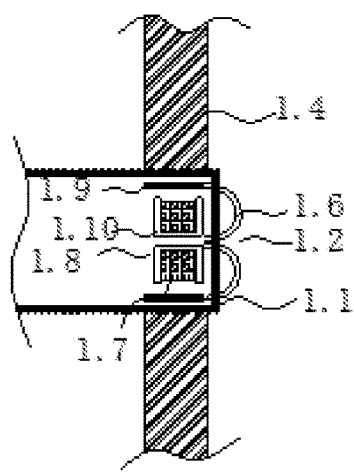
FIG. 1c shows an internal structure diagram of an inductive sensor without a prior art ferrite pot core.

In the drawings, reference signs are as follows: 1.1—housing; 1.2—detection area; 1.3—cable; 1.4—metal around the sensor; 1.5—ferrite pot core; 1.6—magnetic field line; 1.7—coil; 1.8—coil system, 1.9—short circuit ring; 1.10—plastic pipe; 2.1—electronic switch; 2.2 and 2.3—detection coil; 2.4—microprocessor; 2.5—low-impedance output; 2.6 and 2.7—resonant capacitor; 2.8 and 2.9—resonant voltage; 2.10—differential amplifier; 2.11—differential signal; 2.12 and 2.13—shielding coil; 2.14—buffer (voltage follower); 2.15—output signal.

DETAILED DESCRIPTIONS

The present invention will now be further described with reference to specific examples and the accompanying drawings.

Figure 2A:
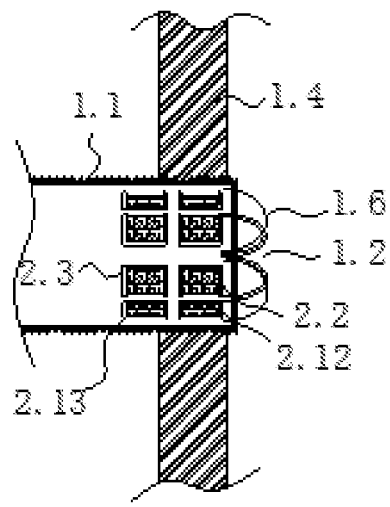
FIG. 2a shows a schematic view showing the internal structure of the inductive sensor in accordance with one embodiment of the present invention.
Figure 2B:
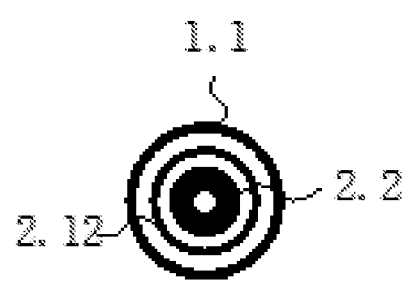

As shown in FIGS. 2a and 2b, two detection coils 2.2 and 2.3 are connected in series and are then successively arranged inside a housing in the axial direction of a sensor, wherein the detection coil 2.2 is provided in front of the detection coil 2.3. The detection coil 2.3 is 5 mm away from the detection coil 2.2 in the front. The side surfaces of the two detection coils 2.2 and 2.3 are surrounded by shielding coils 2.12 and 2.13, and the number of turns of the coils 2.2 and 2.3 is larger than that of the shielding coils 2.12 and 2.13.

Figure 3:
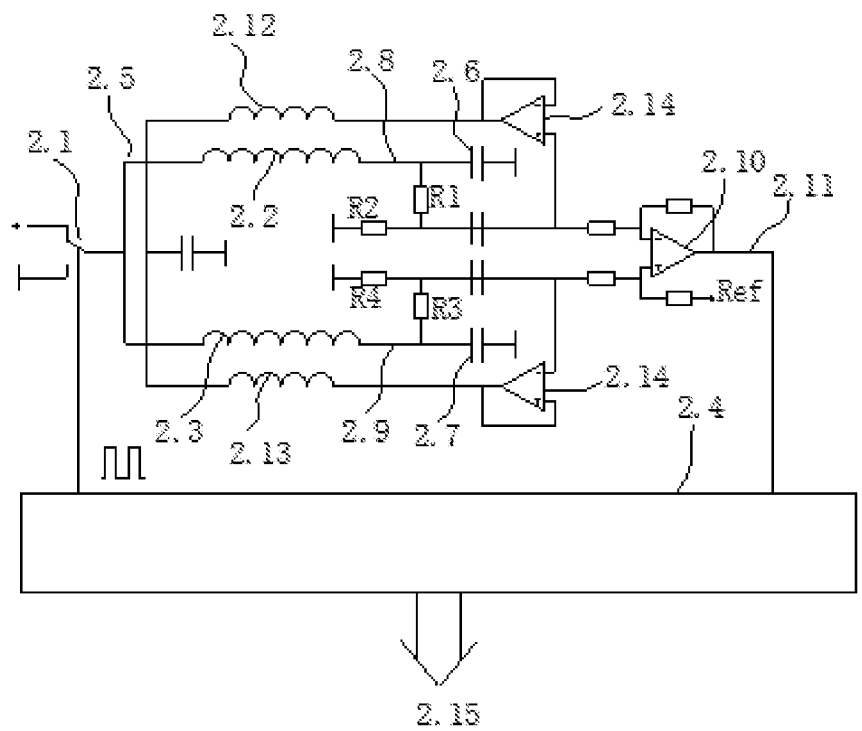
FIG. 3 shows a schematic diagram of a testing circuit without a ferrite pot core in the inductive sensor in accordance with one embodiment of the present invention.

As shown in FIG. 3, a testing circuit is used in an inductive sensor without a ferrite pot core type. A microprocessor 2.4 controls an electronic switch 2.1 connected to a power supply, such that the switching frequency is 250 kHz to provide a low-impedance output 2.5. The detection coil 2.2 and the resonant capacitor 2.6 constitute a first resonant circuit, and the detection coil 2.3 and the resonant capacitor 2.7 constitute a second resonant circuit. The two resonant circuits are identical in the resonant frequency and are connected in parallel to the low-impedance output 2.5. The resonant voltages 2.8 and 2.9 generated by the two resonant circuits are respectively divided by comparison resistors R1 and R2 as well as comparison resistors R3 and R4, and are then connected to the positive and negative input ends of a differential amplifier 2.10. The shielding coil 2.12 surrounds the detection coil 2.2, and the shielding coil 2.13 surrounds the detection coil 2.3. The shielding coils 2.12 and 2.13 are also connected, via a voltage follower 2.14, to the positive and negative input ends of the differential amplifier 2.10, respectively. That is, the voltage-divided resonant voltages 2.8 and 2.9 drive the shielding coils 2.12 and 2.13. The voltage division ratio of the comparison resistors R1 and R2 is the same as that of the comparison resistors R3 and R4. The number of turns of the detection coils 2.2 and 2.3 is larger than that of the shielding coils 2.12 and 2.13. A ratio of the number of turns of the shielding coils 2.12 and 2.13 to the number of turns of the detection coils 2.2 and 2.3 are identical and are proportional to the voltage division ratio of the comparison resistors R1 and R2.

Figure 4:
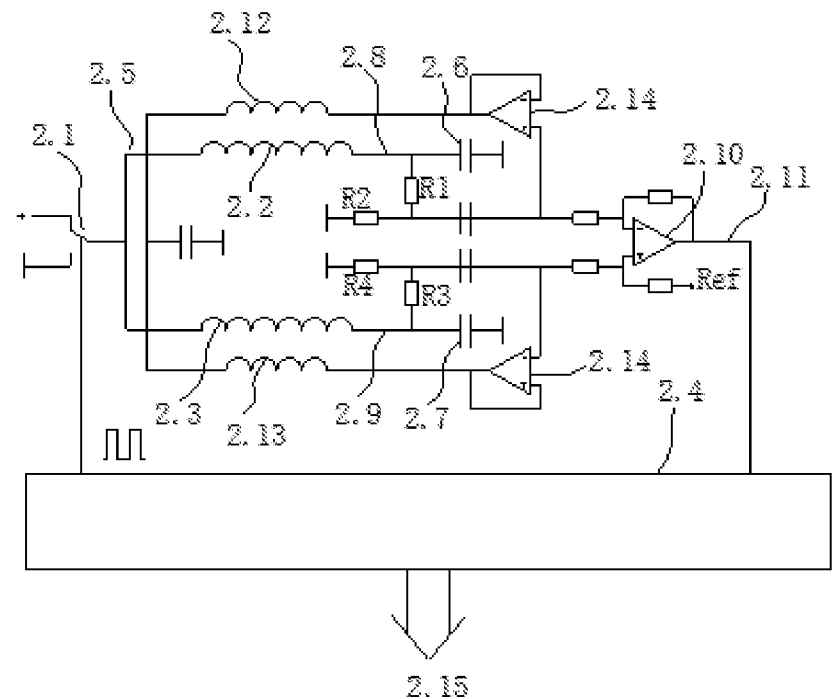
FIG. 4 shows a schematic diagram of a testing circuit with a ferrite pot core in the inductive sensor in accordance with one embodiment of the present invention.

As shown in FIG. 4, a testing circuit is used in an inductive sensor with a ferrite pot core type. The detection coils 2.2 and 2.3 are connected in parallel to the low-impedance output 2.5. The low-impedance output 2.5 directly drives the detection coils 2.2 and 2.3. The shielding coil 2.12 surrounds the detection coil 2.2, and the shielding coil 2.13 surrounds the detection coil 2.3. The detection coil 2.2 and the resonant capacitor 2.6 constitute a first resonant circuit, and the detection coil 2.3 and the resonant capacitor 2.7 constitute a second resonant circuit. Resonant voltages 2.8 and 2.9 generated by the two resonant circuits are respectively divided by comparison resistors R1 and R2 as well as comparison resistors R3 and R4, and are then connected to the positive and negative input ends of a differential amplifier 2.10. In this circuit, the coupling coefficient between the shielding coil 2.12 and the detection coil 2.2 and the coupling coefficient between the shielding coil 2.13 and the detection coil 2.3 are sufficiently large. Because the magnetic fields generated by the shielding coils 2.12 and 2.13 are very strong, the magnetic field strength is not appreciably attenuated by the eddy current loss generated around the housing 1.1 and the short circuit ring 1.9, such that the resonant voltages 2.8 and 2.9 remain substantially constant.

The magnetic fields generated by the detection coils 2.2 and 2.3 as well as the shielding coils 2.12 and 2.13 are opposite in directions and partially cancel out each other. By adjusting the ratio of the number of turns of the detection coils 2.2 and 2.3 to the number of turns of the shielding coils 2.12 and 2.13, the magnetic fields generated by the detection coils 2.2 and 2.3 as well as the shielding coils 2.12 and 2.13 are attenuated to the same extent when subjected to external interference. That is, the summed (overlap) magnetic field strength of the detection coil 2.2 and the shield coil 2.12 and the summed (overlap) magnetic field strength of the detection coil 2.3 and the shielding coil 2.13 are kept constant. The detection coils 2.2 and 2.3 and the resonant capacitors 2.6 and 2.7 in the two resonant circuits are adjusted, such that the resonant voltages 2.8 and 2.9 are not attenuated, and basically remain constant.

The resonant voltages 2.8 and 2.9 are identical when there is no metal near the detection area in front of the sensor. That is, the differential amplifier 2.10 has no output. When a metal is located near the detection area in front of the sensor, because the detection coil 2.2 is provided in front of the detection coil 2.3, the influences of the metal on the magnetic fields generated by the detection coils 2.2 and 2.3 are different. As a result, the resonant voltages 2.8 and 2.9 are different. The differential amplifier 2.10 outputs a differential signal 2.11, and a microprocessor 2.4 determines whether there is a metal near the sensor based on the differential signal 2.11.

What is claimed is:

1. A method for shielding an inductive sensor, comprising: arranging an annular shielding coil outside each of two annular detection coils, arranged adjacently in an axial direction of the inductive sensor, such that the annular shielding coil surrounds the each of the two annular detection coils, wherein the two annular detection coils are each connected in series with a resonant capacitor to form two resonant circuits that have an identical resonant frequency, and wherein a radial thickness of the annular shielding coil is smaller than a radial thickness of the each of the two annular detection coils, and a magnetic field generated by the annular shielding coil and a magnetic field generated by the each of the two annular detection coils are opposite in directions such that they partially cancel out each other, and the magnetic field generated by the annular shielding coil and the magnetic field generated by the each of the two annular detection coils are decreased or increased at the same time, such that a sum of a strength of the magnetic field generated by the annular shielding coil and a strength of the magnetic field generated by the each of the two annular detection coils is kept constant.

2. An inductive sensor employing the method for shielding the inductive sensor according to claim 1, comprising:
   a housing of the sensor;
   two annular detection coils, which are successively arranged along an axial direction of the housing, provided inside the housing, wherein the two annular detection coils are each connected in series with a resonant capacitor to form two resonant circuits that have an identical resonant frequency; and
   an annular shielding coil surrounding each of the two annular detection coils, wherein a radial thickness of the shielding coil is smaller than a radial thickness of the each of the two annular detection coils.

3. The inductive sensor according to claim 2, wherein the two annular detection coils are wound on a plastic pipe, and an insulating material is filled between the each of the two annular detection coils and the surrounding annular shielding coil.

4. The inductive sensor according to claim 3, further comprising a testing circuit, wherein the testing circuit comprises the two resonant circuits, voltage dividing circuits, a shielding circuit, and a differential amplifying circuit, wherein the two resonant circuits are connected in parallel to an output end of a power source; two resonant voltages generated by the two resonant circuits are, respectively, divided by the voltage dividing circuits having a same voltage division ratio and are then connected to a positive input end and a negative input end of the differential amplifying circuit; the two shielding coils are each connected via a voltage follower to the positive input end and the negative input end of the differential amplifying circuit; a ratio of a number of turns of the detection coil to a number of turns of the shielding coil surrounding the detection coil is proportional to the voltage division ratio of the voltage dividing circuit.

5. The inductive sensor according to claim 2, wherein the two annular detection coils are wound on a ferrite pot core, and the annular shielding coil is wound on a housing of the ferrite pot core.

6. The inductive sensor according to claim 5, further comprising a testing circuit; wherein the testing circuit comprises the two resonant circuits, voltage dividing circuits, a shielding circuit, and a differential amplifying circuit; the two shielding coils are, respectively, connected in parallel to an output end of a voltage source; two resonant voltages generated by the two resonant circuits are, respectively, divided by the voltage dividing circuits having a same voltage division ratio and are then connected to a positive input end and a negative input end of the differential amplifying circuit; a ratio of a number of turns of each of the at least two annular detection coils to a number of turns of each of the at least one annular shielding coil surrounding the each of the at least two annular detection coils is proportional to the voltage division ratio of the voltage dividing circuit.

* * * * *